US012597938B2

(12) United States Patent (10) Patent No.: US 12,597,938 B2

Fu et al. (45) Date of Patent: Apr. 7, 2026

(54) METHOD FOR MEASURING DAC NONLINEARITY ERROR BASED ON PSEUDO-RANDOM SEQUENCE

(71) Applicant: CHINA JILIANG UNIVERSITY, Hangzhou (CN)

(72) Inventors: Yaqiong Fu, Hangzhou (CN); Jianting Zhao, Hangzhou (CN); Yunfeng Lu, Hangzhou (CN); Lushuai Qian, Hangzhou (CN)

(73) Assignee: CHINA JILIANG UNIVERSITY, Hangzhou (CN)

( * ) Notice: Subject to any disclaimer, the term of this patent is extended or adjusted under 35 U.S.C. 154(b) by 174 days.

(21) Appl. No.: 18/743,288

(22) Filed: Jun. 14, 2024

(65) Prior Publication Data

US 2025/0330186 A1 Oct. 23, 2025

(30) Foreign Application Priority Data

Apr. 22, 2024 (CN) .......................... 202410491202.4

(51) Int. Cl.
H03M 1/06 (2006.01)
H03M 1/10 (2006.01)

(52) U.S. Cl.
CPC ....... H03M 1/0604 (2013.01); H03M 1/1071 (2013.01)

(58) Field of Classification Search
CPC .......................... H03M 1/0604; H03M 1/1071

USPC .......................................... 341/118, 131, 144
See application file for complete search history.

(56) References Cited

U.S. PATENT DOCUMENTS

| | | | |
|---|---|---|---|
| 7,554,471 B2 * | 6/2009 | Tsai .................... | H03M 1/0641 |
| | | | 341/131 |
| 2020/0162088 A1 * | 5/2020 | Eielsen ..................... | H03F 3/45 |

* cited by examiner

*Primary Examiner* — Khai M Nguyen
(74) *Attorney, Agent, or Firm* — Leber IP Law; Faustino Lichauco

(57) ABSTRACT

Provided is a method for measuring a DAC nonlinearity error based on a pseudo-random sequence. The method includes: numbering pseudo-random number values in a pseudo-random sequence to generate a serial number sequence; arranging the pseudo-random number values in the serial number sequence in a descending or ascending order to determine an order random array; sending the pseudo-random number values, as DAC code values, in the order random array to the DAC sequentially; determining a first differential voltage array and a second differential voltage array according to a voltage corresponding to the DAC code values and the DAC code values; and determining a nonlinearity error measurement result of the DAC according to a differential nonlinearity error test result of the DAC and an integral nonlinearity error test result of the DAC determined by the first differential voltage array and the second differential voltage array.

9 Claims, 2 Drawing Sheets

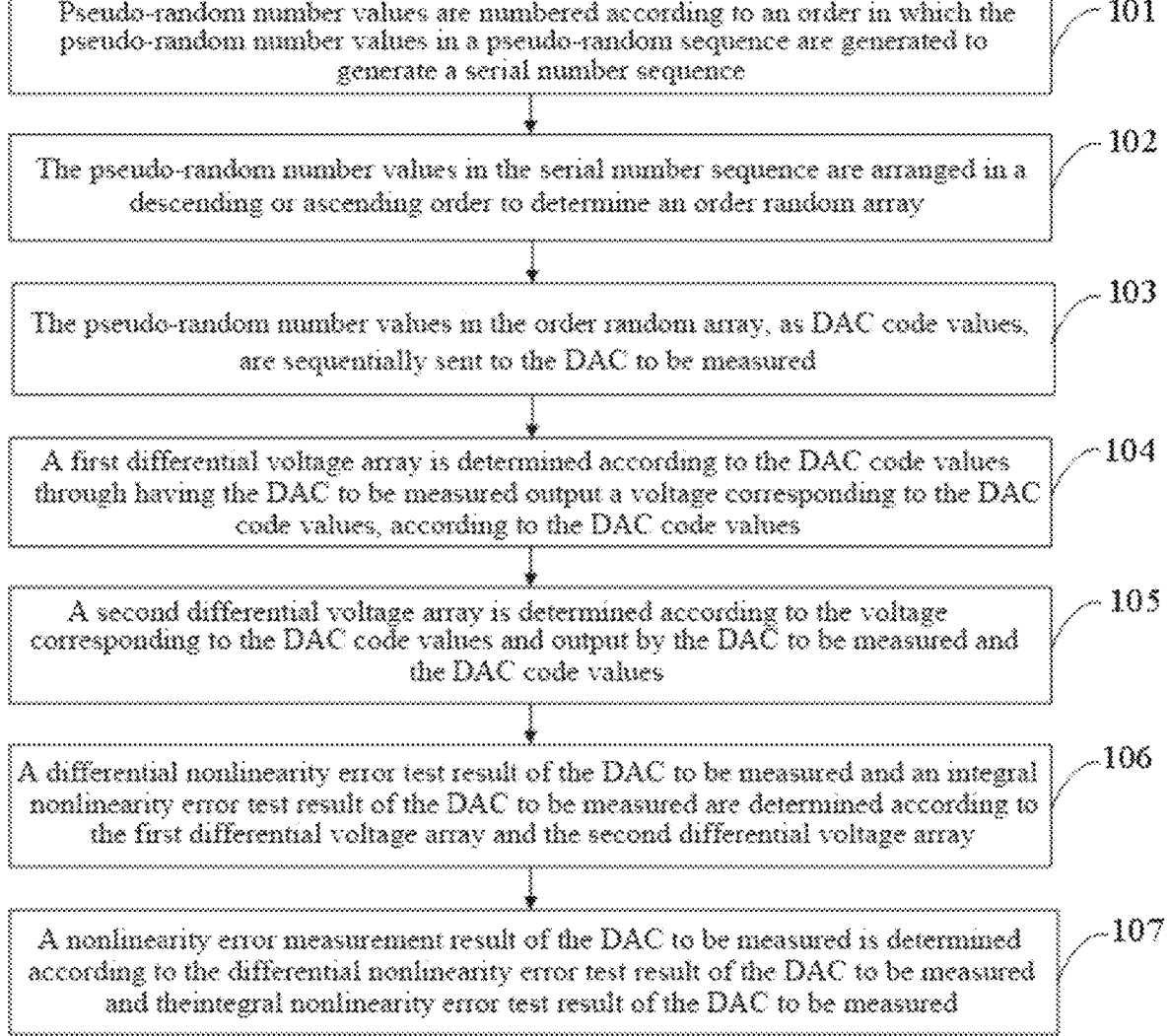

Pseudo-random number values are numbered according to an order in which the pseudo-random number values in a pseudo-random sequence are generated to generate a serial number sequence ⌐101

The pseudo-random number values in the serial number sequence are arranged in a descending or ascending order to determine an order random array ⌐102

The pseudo-random number values in the order random array, as DAC code values, are sequentially sent to the DAC to be measured ⌐103

A first differential voltage array is determined according to the DAC code values through having the DAC to be measured output a voltage corresponding to the DAC code values, according to the DAC code values ⌐104

A second differential voltage array is determined according to the voltage corresponding to the DAC code values and output by the DAC to be measured and the DAC code values ⌐105

A differential nonlinearity error test result of the DAC to be measured and an integral nonlinearity error test result of the DAC to be measured are determined according to the first differential voltage array and the second differential voltage array ⌐106

A nonlinearity error measurement result of the DAC to be measured is determined according to the differential nonlinearity error test result of the DAC to be measured and the integral nonlinearity error test result of the DAC to be measured ⌐107

FIG. 1

METHOD FOR MEASURING DAC NONLINEARITY ERROR BASED ON PSEUDO-RANDOM SEQUENCE

CROSS-REFERENCE TO RELATED APPLICATION

This patent application claims the benefit and priority of Chinese Patent Application No. 202410491202.4 filed with the China National Intellectual Property Administration on Apr. 22, 2024, the disclosure of which is incorporated by reference herein in its entirety as part of the present application.

TECHNICAL FIELD

The present disclosure relates to the technical field of Digital-to-Analog Converter (DAC) nonlinearity error measurement, in particular to a method for measuring a DAC nonlinearity error based on a pseudo-random sequence.

BACKGROUND

A DAC is a device that converts digital signals into analog signals, which is widely used in the fields of precision measurement, industrial control, communication, and the like. The linearity of the DAC (also referred to as a nonlinearity error) is one of the important factors that determine its overall precision. The linearity of the DAC can be quantitatively characterized by two parameters: an Integral Nonlinearity (INL) error and a Differential nonlinearity (DNL) error. By using measurement results of the DAC nonlinearity error, the performance can be evaluated, and an error value can be corrected or compensated to improve the output precision of the DAC.

During the routine test of DAC nonlinearity errors, a high-precision voltmeter can be used to measure code values output by the DAC step by step, or a high-precision programmable standard voltage source can be used to compare with the DAC to be measured step by step, so as to measure the DAC nonlinearity errors. In addition, there are some methods to realize self-calibration through an internal circuit of the DAC chip. However, no matter which method is used to measure the DAC nonlinearity errors, the measurement precision is affected by temperature. The temperature change that affects the measurement precision mainly comes from two aspects: one aspect is the change in environmental temperature; the other aspect is the temperature change resulted from the change of the internal self-heating power when the DAC outputs different code values. Due to the fact that the time scale of temperature change is close to the time scale of nonlinearity measurement, and there is a strong coupling relationship between the steps of the DAC code values and the temperature change trend, when the DAC code values are output step by step, the higher the steps of the code values, the greater the temperature change resulted from the change in the internal self-heating power and the greater the measurement result error, so that the measurement precision of the measurement result of the DAC nonlinearity error is lower. Therefore, it is extremely difficult to separate the errors introduced by temperature change, and thus the measurement result of the DAC nonlinearity error is affected by temperature, resulting in a low measurement result in precision.

In the prior art, the method to improve the precision of the measurement result of the DAC nonlinearity error is to provide a high-stability temperature environment through a thermostatic device and prolong the self-heating stabilization time after each switch of DAC code values, so as to obtain a high-precision measurement result. However, a high cost of the thermostatic device causes a high cost of improving the precision of the measurement result of DAC nonlinearity errors by using the thermostatic device.

SUMMARY

The purpose of the present disclosure is to provide a method for measuring a DAC nonlinearity error based on a pseudo-random sequence, so as to solve a problem that a high cost of the thermostatic device causes a high cost of improving the precision of the measurement result of DAC nonlinearity errors by using the thermostatic device in the prior art.

In order to achieve the above purpose, the present disclosure provides the following scheme.

A method for measuring a DAC nonlinearity error based on a pseudo-random sequence, including:

numbering pseudo-random number values in a pseudo-random sequence according to an order in which the pseudo-random number values are generated so as to generate a serial number sequence;

arranging the pseudo-random number values in the serial number sequence in a descending or ascending order to determine an order random array;

sending the pseudo-random number values, as DAC code values, in the order random array to the DAC to be measured sequentially;

determining a first differential voltage array, through having the DAC to be measured output a voltage corresponding to the DAC code values, according to the DAC code values;

determining a second differential voltage array according to the voltage corresponding to the DAC code values and outputted by the DAC to be measured and the DAC code values;

determining a differential nonlinearity error test result of the DAC to be measured and an integral nonlinearity error test result of the DAC to be measured according to the first differential voltage array and the second differential voltage array; and determining a nonlinearity error measurement result of the DAC to be measured according to the differential nonlinearity error test result of the DAC to be measured and the integral nonlinearity error test result of the DAC to be measured.

In the embodiment, the determining a differential nonlinearity error test result of the DAC to be measured and an integral nonlinearity error test result of the DAC to be measured according to the first differential voltage array and the second differential voltage array, includes:

determining an intermediate variable array according to the first differential voltage array and the second differential voltage array;

determining a first error array of voltage steps between adjacent DAC code values according to the intermediate variable array;

determining the differential nonlinearity error test result of the DAC to be measured according to the first error array;

determining a second error array of the voltage steps between the adjacent DAC code values according to the first error array; and determining the integral nonlinearity error test result of the DAC to be measured according to the second error array.

In the embodiment, the numbering pseudo-random number values in a pseudo-random sequence according to an order in which the pseudo-random number values are generated so as to generate a serial number sequence includes:

acquiring the pseudo-random sequence containing $2^n$ pseudo-random number values;

numbering the pseudo-random number values according to the order in which the pseudo-random number values in the pseudo-random sequence are generated; wherein the serial number is from 0 to $2^n-1$; n is the number of bits of the DAC to be measured.

In the embodiment, the determining a first differential voltage array through having the DAC to be measured output a voltage corresponding to the DAC code values, according to the DAC code values, includes:

acquiring two voltages output by the DAC to be measured, wherein each of the two voltages corresponds to the DAC code values;

determining a differential voltage according to the two voltages;

amplifying the differential voltage by an instrumentation amplifier to determine the first differential voltage array.

In the embodiment, the determining an intermediate variable array according to the first differential voltage array and the second differential voltage array, includes:

determining the intermediate variable array by using an equation $$d[i] = \frac{V_1[i] - V_0[i]}{G}$$

according to the first differential voltage array, the second differential voltage array and gain of the instrumentation amplifier;

where d[i] is the i-th element in the intermediate variable array, i=0, 1, 2 . . . , $2^n-2$, n is the number of bits of the DAC to be measured, G is the gain of the instrumentation amplifier, $V_0[i]$ is the i-th element in the first differential voltage array, and $V_1[i]$ is the i-th element in the second differential voltage array.

In the embodiment, the determining a first error array of voltage steps between adjacent DAC code values according to the intermediate variable array, includes:

determining the first error array of the voltage steps between the adjacent DAC code values by using an equation $$e_1[i] = \frac{(2^n - 1)d[i] - \sum\limits_{j=0}^{2^n-2} d[j]}{\sum\limits_{j=0}^{2^n-2} d[j]}$$

according to the intermediate variable array;

where $e_1[i]$ is the i-th element in the first error array, n is the number of bits of the DAC to be measured, and d[j] is the j-th element in the intermediate variable array, in which j=0, 1, . . . , $2^n-2$.

In the embodiment, the determining the differential non-linearity error test result of the DAC to be measured according to the first error array, includes:

setting a maximum absolute value in the first error array as the differential nonlinearity error test result of the DAC to be measured.

In the embodiment, the determining a second error array of the voltage steps between the adjacent DAC code values according to the first error array, includes:

determining the second error array of the voltage steps between the adjacent DAC code values by using an equation $$e_2[i] = \sum\limits_{j=0}^{2^n-2} e_1[j]$$

according to the first error array;

where $e_2[i]$ is the i-th element in the second error array, and $e_1[j]$ is the j-th element in the first error array.

In the embodiment, the determining the integral nonlinearity error test result of the DAC to be measured according to the second error array, includes:

setting a maximum absolute value in the second error array as the integral nonlinearity error test result of the DAC to be measured.

Based on specific embodiments according to the present disclosure, the present disclosure provides the following technical effects.

The present disclosure provides a method for measuring a DAC nonlinearity error based on a pseudo-random sequence, which includes: numbering pseudo-random number values according to an order in which the pseudo-random number values, in a pseudo-random sequence, are generated so as to generate a serial number sequence; arranging the pseudo-random number values in the serial number sequence in a descending or ascending order to determine an order random array; sending the pseudo-random number values, as DAC code values sequentially, in the order random array to the DAC to be measured; determining a first differential voltage array according to a voltage corresponding to the DAC code values output by the DAC to be measured; determining a second differential voltage array according to the voltage corresponding to the DAC code values and outputted by the DAC to be measured and the DAC code values; and determining a nonlinearity error measurement result of the DAC to be measured according to a differential nonlinearity error test result of the DAC to be measured and an integral nonlinearity error test result of the DAC to be measured determined by the first differential voltage array and the second differential voltage array. Due to the series of the DAC code values corresponding to the order of pseudo-random number values in the order random array, and random pseudo-random number values in the order random array, the series of the DAC code values sequentially input into the DAC to be measured, according to the order of pseudo-random number values in the order random array, are also random. Therefore, when the nonlinearity error is measured, the strong correlation coupling relationship between the series of the pseudo-random number values in the order random array as the DAC code values and the temperature change trend is converted into a random relationship, which causes the self-heating power approximately constant in the whole process of measuring the DAC nonlinearity errors, thereby separating the errors introduced by temperature change, and thus improving the precision of the measurement result of the DAC nonlinearity errors without a high-cost thermostatic device.

BRIEF DESCRIPTION OF THE DRAWINGS

In order to explain the embodiments of the present disclosure or the technical schemes in the prior art more clearly, the drawings that need to be used in the embodiments will be briefly introduced hereinafter. Obviously, the drawings in the following description are only some embodiments of the present disclosure. For those skilled in the art, other drawings can be obtained according to these drawings without creative labor.

FIG. 1 is a flowchart of a method for measuring a DAC nonlinearity error based on a pseudo-random sequence according to the present disclosure.

DESCRIPTION OF REFERENCE NUMERALS

Figure 2:
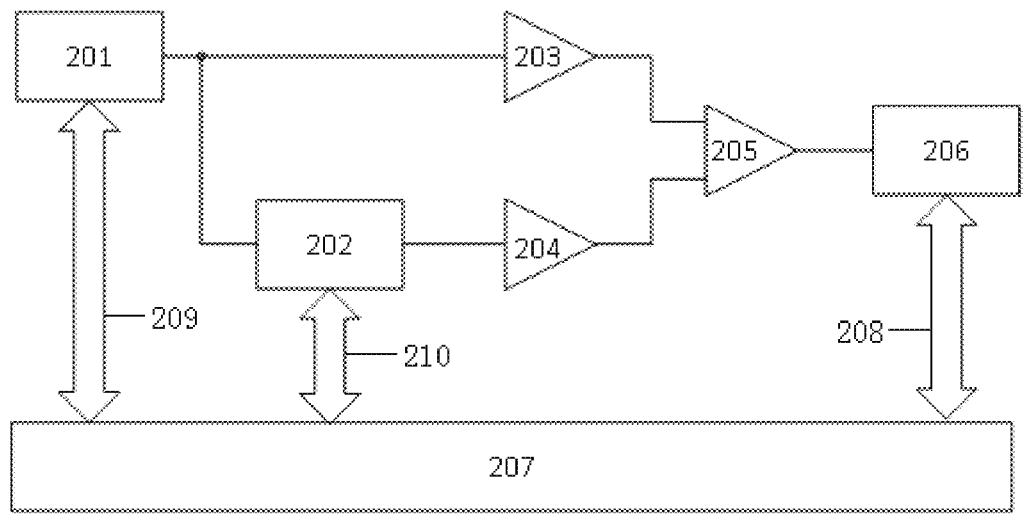
FIG. 2 is a circuit diagram for measuring a DAC nonlinearity error based on a pseudo-random sequence.

DAC to be measured—201, sample/hold module—202, first buffer—203, second buffer—204, instrumentation amplifier—205, analog-to-digital converter—206, microprocessor—207, first data bus—208, second data bus—209, third data bus—210.

DETAILED DESCRIPTION OF THE EMBODIMENTS

The technical schemes in the embodiments of the present disclosure will be clearly and completely described with reference to the drawings in the embodiments of the present disclosure hereinafter. Obviously, the described embodiments are only some embodiments of the present disclosure, rather than all of the embodiments. Based on the embodiment of the present disclosure, all other embodiments obtained by those skilled in the art without creative labor fall within the scope of protection of the present disclosure.

The purpose of the present disclosure is to provide a method for measuring a DAC nonlinearity error based on a pseudo-random sequence, aiming at converting the strong correlation coupling relationship between the series of the pseudo-random number values, as the DAC code values, in the order random array and the temperature change trend into a random relationship, thereby causing the self-heating power approximately constant in the whole process of measuring the DAC nonlinearity errors, so as to separate the nonlinearity errors of the DAC to be measured from the error resulted from temperature change. Thus, the precision of the measurement result of the DAC nonlinearity errors is improved without a high-cost thermostatic device.

In order to make the above objects, features and advantages of the present disclosure more obvious and understandable, the present disclosure will be explained in further detail with reference to the drawings and detailed description hereinafter.

As shown in FIG. 1, a method for measuring a DAC nonlinearity error based on a pseudo-random sequence includes the following steps.

Step 101, pseudo-random number values are numbered according to an order in which the pseudo-random number values in a pseudo-random sequence are generated to generate a serial number sequence.

The serial number is from 0 to $2^n-1$.

Step 102, the pseudo-random number values in the serial number sequence are arranged in a descending or ascending order to determine an order random array.

Step 103, the pseudo-random number values in the order random array, as DAC code values, are sequentially sent to the DAC to be measured.

The DAC code values range from 0 to $2^n-1$, and n is the number of bits of the DAC to be measured.

Step 104, a first differential voltage array is determined according to the DAC code values through having the DAC to be measured output a voltage corresponding to the DAC code values, according to the DAC code values.

Step 105, a second differential voltage array is determined according to the voltage corresponding to the DAC code values and output by the DAC to be measured and the DAC code values.

Step 106, a differential nonlinearity error test result of the DAC to be measured and an integral nonlinearity error test result of the DAC to be measured are determined according to the first differential voltage array and the second differential voltage array.

Step 107, a nonlinearity error measurement result of the DAC to be measured is determined according to the differential nonlinearity error test result of the DAC to be measured and the integral nonlinearity error test result of the DAC to be measured.

Further, Step 101 includes: acquiring the pseudo-random sequence containing $2^n$ pseudo-random number values; numbering the pseudo-random number values according to the order in which the pseudo-random number values in the pseudo-random sequence are generated; wherein the serial number is from 0 to $2^n-1$; n is the number of bits of the DAC to be measured.

Further, Step 104 specifically includes: acquiring two voltages output by the DAC to be measured, wherein each of the two voltages corresponds to the DAC code values; determining a differential voltage according to the two voltages; amplifying the differential voltage by an instrumentation amplifier to determine the first differential voltage array.

Further, Step 106 specifically includes the following steps.

An intermediate variable array is determined according to the first differential voltage array and the second differential voltage array; a first error array of voltage steps between adjacent DAC code values is determined according to the intermediate variable array; the differential nonlinearity error test result of the DAC to be measured is determined according to the first error array; a second error array of the voltage steps between the adjacent DAC code values is determined according to the first error array; and the integral nonlinearity error test result of the DAC to be measured is determined according to the second error array.

Further, the determining an intermediate variable array according to the first differential voltage array and the second differential voltage array specifically includes: determining the intermediate variable array by using an equation $$d[i] = \frac{V_1[i] - V_0[i]}{G},$$

according to the first differential voltage array, the second differential voltage array and gain of the instrumentation amplifier.

Where d[i] is the i-th element in the intermediate variable array, i=0, 1, 2 . . . , $2^n$–2, n is the number of bits of the DAC to be measured, G is the gain of the instrumentation amplifier, $V_0$[i] is the i-th element in the first differential voltage array, and $V_1$[i] is the i-th element in the second differential voltage array.

Further, the determining a first error array of voltage steps between adjacent DAC code values according to the intermediate variable array specifically includes: determining the first error array of the voltage steps between the adjacent DAC code values by using an equation $$e_1[i] = \frac{(2^n - 1)d[i] - \sum_{j=0}^{2^n-2} d[j]}{\sum_{j=0}^{2^n-2} d[j]},$$

according to the intermediate variable array.

Where $e_1$[i] is the i-th element in the first error array, n is the number of bits of the DAC to be measured, and d[j] is the j-th element in the intermediate variable array, in which j=0, 1, . . . , $2^n$–2.

Further, the determining the differential nonlinearity error test result of the DAC to be measured according to the first error array specifically includes: setting a maximum absolute value in the first error array as the differential nonlinearity error test result of the DAC to be measured.

Further, the determining a second error array of the voltage steps between the adjacent DAC code values according to the first error array specifically includes: determining the second error array of the voltage steps between the adjacent DAC code values by using an equation $$e_2[i] = \sum_{j=0}^{2^n-2} e_1[j],$$

according to the first error array.

Where $e_2$[i] is the i-th element in the second error array, and $e_1$[i]; is the j-th element in the first error array.

Further, the determining the integral nonlinearity error test result of the DAC to be measured according to the second error array specifically includes: setting a maximum absolute value in the second error array as the integral nonlinearity error test result of the DAC to be measured.

The process of measuring a DAC nonlinearity error by using the method for measuring a DAC nonlinearity error based on the pseudo-random sequence according to the present disclosure is specifically as follow steps.

(1) A pseudo-random sequence SEQ1 containing $2^n$ pseudo-random number values is generated, and pseudo-random number values in the pseudo-random sequence SEQ1 are numbered with the serial numbers 0 to $2^n$–1, according to an order in which the pseudo-random number values are generated.

(2) The serial numbers 1 to $2^n$ associated with the pseudo-random sequence SEQ 1 are reordered in a descending or ascending order of the pseudo-random number values in the pseudo-random sequence SEQ1, so as to obtain an order random sequence SEQ2 which contain numerical values ranged from 0 to $2^n$–1 but are in a random order. The order random sequence SEQ2 is stored as an order random array SEQ2[$2^n$] in the form of an array which can be processed by a computer.

(3) It is assumed that i=0.

(4) The pseudo-random number values SEQ2[i] in the order random array, as DAC code values, are sent to the DAC to be measured, so that the DAC to be measured outputs a voltage corresponding to the DAC code value, and at the same time, the sample/hold module configured to collect the voltage corresponding to the DAC code value is switched to "sampling" mode. After delay for a short time until the voltage signal is stable, the sample/hold module is switched to "holding" mode. A microcontroller reads the first differential voltage amplified by the instrumentation amplifier through the ADC, and records the first differential voltage value in the first differential voltage array $V_0$[SEQ2[i]].

(5) The current DAC code value is checked to determine whether the current DAC code value is $2^n$–1; If so, this step is skipped, i.e., proceeding to step (6); if not, the DAC code value of the DAC to be measured is increased by 1, the second differential voltage amplified by the instrumentation amplifier is read through the ADC, and the second differential voltage value is recorded in the second differential voltage array $V_1$[SEQ2[i]].

(6) The value of i, starting from 0, is incremented by 1, for each execution of (4) to (5), and the steps (4) to (5) are repeatedly executed until the value of i is up to $2^n$–1. The first differential voltage array $V_0$ obtained finally contains $2^n$ first differential voltage values, and the $V_1$ array contains $2^n$–1 second differential voltage values.

(7) The intermediate variable array is determined by using an equation $$d[i] = \frac{V_1[i] - V_0[i]}{G}.$$

Where, d[i] is the i-th element in the intermediate variable array, i=0, 1, 2 . . . , $2^n$–2, n is the number of bits of the DAC to be measured, G is the gain of the instrumentation amplifier, $V_0$[i] is the i-th element in the first differential voltage array, and $V_1$[i] is the i-th element in the second differential voltage array.

(8) The first error array of the voltage steps between the adjacent DAC code values is determined by using an equation $$e_1[i] = \frac{(2^n - 1)d[i] - \sum_{j=0}^{2^n-2} d[j]}{\sum_{j=0}^{2^n-2} d[j]}$$

according to the intermediate variable array.

Where, $e_1$[i] is the i-th element in the first error array, n is the number of bits of the DAC to be measured, and d[j] is the j-th element in the intermediate variable array, in which j=0, 1, . . . , $2^n$–2.

A maximum absolute value in the first error array is set as the differential nonlinearity error test result of the DAC to be measured.

(9) The second error array reflecting the error accumulation of the voltage steps between the DAC code values is determined by using an equation $$e_2[i] = \sum_{j=0}^{2^n-2} e_1[j]$$

according to the first error array.

Where, $e_2[i]$ is the i-th element in the second error array, and $e_1[j]$ is the j-th element in the first error array.

A maximum absolute value in the second error array is set as the integral nonlinearity error test result of the DAC to be measured.

It should be noted that the pseudo-random sequence can be generated by using a linear congruential generator. The algorithm of generating the pseudo-random sequence is a conventional technology, which can be achieved by calling functions with C language. When a plurality of pseudo-random sequences is used to measure the DAC nonlinearity errors, different seeds should be used for generating pseudo-random sequences respectively to avoid the generation of the same random sequence.

In order to facilitate the understanding of the method for measuring the DAC nonlinearity error based on the pseudo-random sequence according to the present disclosure, a circuit for measuring a DAC nonlinearity error based on a pseudo-random sequence is introduced hereinafter, as shown in FIG. 2. The DAC nonlinearity error is measured by the circuit for measuring the DAC nonlinearity error based on the pseudo-random sequence using the method for measuring the DAC nonlinearity error based on the pseudo-random sequence according to the present disclosure.

A circuit for measuring a DAC nonlinearity error based on a pseudo-random sequence includes a DAC to be measured 201, a sample/hold module 202, a first buffer 203, a second buffer 204, an instrumentation amplifier 205, an ADC 206, a microprocessor 207, a first data bus 208, a second data bus 209 and a third data bus 210.

The DAC to be measured 201 is configured to output the voltage corresponding to the DAC code value. The DAC to be measured 201 is usually a DAC with bits of 8 to 20.

The sample/hold device 202, connected with the DAC to be measured 201, is configured to sample or hold the voltage output by the DAC to be measured 201, and output the sampled or held voltage.

Specifically, the sample/hold device 202 ensures that the method for measuring the DAC nonlinearity error based on the pseudo-random sequence according to the present disclosure can simultaneously obtain adjacent step voltages and measure their differential voltages. The sample/hold 202 generally adopts an integrated sample/hold chip, such as LF398.

The first buffer 203, connected with the DAC to be measured 201 and the instrumentation amplifier 205, is configured to receive a voltage output by the DAC to be measured 201 and transmit the voltage output by the DAC to be measured 201 to the instrumentation amplifier 205.

The second buffer 204, connected with the sample/hold 202 and the instrumentation amplifier 205, is configured to receive the voltage output by the sample/hold 202 and transmit the voltage output by the sample/hold 202 to the instrumentation amplifier 205.

Specifically, the first buffer 203 and the second buffer 204 are unity gain amplification circuits consisted of operational amplifiers. The first buffer 203 and the second buffer 204 do not provide specific calculation parameters, but isolate the impedance of the front and rear stages, thus avoiding errors resulted from impedance mismatch. It should be noted that the second buffer 204 may be omitted in the case that the unity gain buffer is integrated in output stages inside some sample/hold chips. In this method, as isolators, the first buffer 203 and the second buffer 204 can adopt buffers with low noise and low temperature coefficient, such as AD8676.

The instrumentation amplifier 205 is configured to receive the voltage output by the first buffer 203 and the voltage output by the second buffer 204, amplify the differential voltage formed by the voltage output by the first buffer 203 and the voltage output by the second buffer 204 by a high gain factor, and output the amplified differential voltage, so as to match the measured voltage with the input voltage range of later-stage devices (such as the ADC in the present disclosure). The instrumentation amplifier 205 adopts an amplifier with a high common-mode rejection ratio, such as AD8221, to reduce the common-mode influence in the measurement process.

The analog-to-digital converter 206, connected with the instrumentation amplifier 205, is configured to receive the voltage output by the instrumentation amplifier 205, and perform analog-to-digital conversion on the differential voltage output by the instrumentation amplifier 205 and output a differential voltage of discrete digital quantities. The analog-to-digital converter 206 can adopt a high-precision ADC device in the form of single-ended input or differential input, such as the AD7616, which has a built-in voltage reference, thus simplifying the circuit structure.

The microprocessor 207, connected to the analog-to-digital converter 206 through a first data bus 208, connected to the DAC to be measured 201 through a second data bus 209, and connected to the sampling/holding device 202 through a third data bus 210, is configured to receive the voltage output by the analog-to-digital converter 206 through the first data bus 208 and process the voltage to obtain the DAC nonlinearity error, output the DAC code value to the DAC to be measured 201 through the second data bus 209, and control the sample/hold 202 to switch between the sampling and holding states through the third data bus 210.

Specifically, the microprocessor 207 can be a high-performance MCU, such as STM32F103. The DAC code value in the present disclosure is stored in the microprocessor 207.

The technical features of the above embodiments can be combined at will. In order to make the description concise, not all possible combinations of various technical features in the above embodiments are described. However, as long as there is no contradiction between the combinations of these technical features, the combinations should be considered as the scope described in the specification.

In the present disclosure, specific examples are applied to illustrate the principle and implementation of the present disclosure, and the explanations of the above embodiments are only used to help understand the method and core ideas of the present disclosure. At the same time, according to the idea of the present disclosure, there will be some changes in the specific implementation and application scope for those skilled in the art. To sum up, the contents of the specification should not be construed as limiting the present disclosure.

What is claimed is:

1. A method for measuring a Digital-to-Analog Converter (DAC) nonlinearity error based on a pseudo-random sequence, comprising:

numbering pseudo-random number values in a pseudo-random sequence according to an order in which the pseudo-random number values are generated so as to generate a serial number sequence;

arranging the pseudo-random number values in the serial number sequence in a descending or ascending order to determine an order random array;

sending the pseudo-random number values, as DAC code values, in the order random array to the DAC to be measured sequentially;

determining a first differential voltage array, through having the DAC to be measured output a voltage corresponding to the DAC code values, according to the DAC code values;

determining a second differential voltage array according to the voltage corresponding to the DAC code values and outputted by the DAC to be measured and the DAC code values;

determining a differential nonlinearity error test result of the DAC to be measured and an integral nonlinearity error test result of the DAC to be measured according to the first differential voltage array and the second differential voltage array; and determining a nonlinearity error measurement result of the DAC to be measured according to the differential nonlinearity error test result of the DAC to be measured and the integral nonlinearity error test result of the DAC to be measured.

2. The method according to claim 1, wherein the determining a differential nonlinearity error test result of the DAC to be measured and an integral nonlinearity error test result of the DAC to be measured according to the first differential voltage array and the second differential voltage array comprises:

determining an intermediate variable array according to the first differential voltage array and the second differential voltage array;

determining a first error array of voltage steps between adjacent DAC code values according to the intermediate variable array;

determining the differential nonlinearity error test result of the DAC to be measured according to the first error array;

determining a second error array of the voltage steps between the adjacent DAC code values according to the first error array; and determining the integral nonlinearity error test result of the DAC to be measured according to the second error array.

3. The method according to claim 1, wherein the numbering pseudo-random number values in a pseudo-random sequence according to an order in which the pseudo-random number values are generated so as to generate a serial number sequence, comprises:

acquiring the pseudo-random sequence containing $2^n$ pseudo-random number values;

numbering the pseudo-random number values according to the order in which the pseudo-random number values in the pseudo-random sequence are generated; wherein the serial number is from 0 to $2^n-1$; n is a number of bits of the DAC to be measured.

4. The method according to claim 2, wherein the determining a first differential voltage array, through having the DAC to be measured output a voltage corresponding to the DAC code values, according to the DAC code values, comprises:

acquiring two voltages output by the DAC to be measured, wherein each of the two voltages corresponds to the DAC code values;

determining a differential voltage according to the two voltages;

amplifying the differential voltage by an instrumentation amplifier to determine the first differential voltage array.

5. The method according to claim 4, wherein the determining an intermediate variable array according to the first differential voltage array and the second differential voltage array comprises:

determining the intermediate variable array by using an equation $$d[i] = \frac{V_1[i] - V_0[i]}{G},$$

according to the first differential voltage array, the second differential voltage array and a gain of the instrumentation amplifier;

where d[i] is an i-th element in the intermediate variable array, i=0, 1, 2 . . . , $2^n-2$, n is a number of bits of the DAC to be measured, G is the gain of the instrumentation amplifier, $V_0[i]$ is an i-th element in the first differential voltage array, and $V_1[i]$ is an i-th element in the second differential voltage array.

6. The method according to claim 5, wherein the determining a first error array of voltage steps between adjacent DAC code values according to the intermediate variable array comprises:

determining the first error array of the voltage steps between the adjacent DAC code values by using an equation $$e_1[i] = \frac{(2^n - 1)d[i] - \sum_{j=0}^{2^n-2} d[j]}{\sum_{j=0}^{2^n-2} d[j]}$$

according to the intermediate variable array;

where $e_1[i]$ is an i-th element in the first error array, n is the number of bits of the DAC to be measured, and d[j] is a j-th element in the intermediate variable array, in which j=0, 1, . . . , $2^n-2$.

7. The method according to claim 6, wherein the determining the differential nonlinearity error test result of the DAC to be measured according to the first error array comprises:

setting a maximum absolute value in the first error array as the differential nonlinearity error test result of the DAC to be measured.

8. The method according to claim 6, wherein the determining a second error array of the voltage steps between the adjacent DAC code values according to the first error array comprises:

determining the second error array of the voltage steps between the adjacent DAC code values by using an equation $$e_2[i] = \sum_{j=0}^{2^n-2} e_1[j]$$

according to the first error array;

where $e_2[i]$ is an i-th element in the second error array, and $e_1[i]$ is a j-th element in the first error array.

9. The method according to claim 8, wherein the determining the integral nonlinearity error test result of the DAC to be measured according to the second error array comprises:

setting a maximum absolute value in the second error array as the integral nonlinearity error test result of the DAC to be measured.

\* \* \* \* \*